United States Patent [19]

Hoenig

[11] Patent Number: 4,864,237

[45] Date of Patent: Sep. 5, 1989

[54] MEASURING DEVICE HAVING A SQUID MAGNETOMETER WITH A MODULATOR FOR MEASURING MAGNETIC FIELDS OF EXTREMELY LOW FREQUENCY

[75] Inventor: Eckhardt Hoenig, Erlangen, Fed. Rep. of Germany

[73] Assignee: Siemens Aktiengesellschaft, Berlin & Munich, Fed. Rep. of Germany

[21] Appl. No.: 894,685

[22] Filed: Aug. 8, 1986

[30] Foreign Application Priority Data

Aug. 20, 1985 [DE] Fed. Rep. of Germany ....... 3529815

[51] Int. Cl.$^4$ ..................... G01R 33/02; H03K 3/38
[52] U.S. Cl. ..................................... 324/248; 307/306
[58] Field of Search ..................... 324/248; 307/306

[56] References Cited

U.S. PATENT DOCUMENTS

| | | | |
|---|---|---|---|
| 3,184,674 | 5/1965 | Garwin | 323/44 |
| 4,320,341 | 3/1982 | Lutes | 324/248 |
| 4,489,274 | 12/1984 | Berlincourt | 324/248 |
| 4,588,947 | 5/1986 | Ketchen | 324/248 |

FOREIGN PATENT DOCUMENTS 0169070  10/1983  Japan ................................. 324/248

OTHER PUBLICATIONS

Journal of Low Temperature Physics, vol. 51, Nos. 1/2, 1983, pp. 207–224.
SQUID, 1977, pp. 439–484.
Appl. Phys. Lett. 40, 15 Apr. 1982, pp. 736–738.
Electricity and Magnetism, B. I. Bleaney, et al., 1976, p. 187.
IEEE Trans. Magn. 19, No. 3, May 1983, pp. 461–464.
IEEE Trans. Magn. 17, No. 1, Jan. 1981, pp. 400–403.
SQUID '80, 1980, pp. 227–235.

*Primary Examiner*—Reinhard J. Eisenzopf
*Assistant Examiner*—Walter E. Snow
*Attorney, Agent, or Firm*—Kenyon & Kenyon

[57] ABSTRACT

An apparatus for measuring magnetic fields which change only at an extremely low frequency contains a SQUID magnetometer which comprises a superconducting flux transformer for inductively coupling the measuring signal into a d-c SQUID sensor. With this apparatus, also quasi-static magnetic fields with frequencies far below 1 Hz should be detectable. A device for modulating the measuring signal to be coupled into the SQUID sensor is associated at least with the flux transformer, the modulation frequency of which is in a frequency range characteristic for low-noise operation of the SQUID. The modulation frequencies are generally above 1 Hz and optionally even above 1 kHz.

21 Claims, 2 Drawing Sheets

MEASURING DEVICE HAVING A SQUID MAGNETOMETER WITH A MODULATOR FOR MEASURING MAGNETIC FIELDS OF EXTREMELY LOW FREQUENCY

BACKGROUND OF THE INVENTION

The present invention relates to an apparatus for measuring magnetic fields which change with an only extremely low frequency by means of a SQUID magnetometer which comprises a superconducting flux transformer for inductively coupling the measuring signal into a d-c SQUID sensor.

With SQUIDs (superconducting quantum interference devices), magnetometers with high sensitivity to magnetic fields, for instance, in the order of $10^{-14}$ Tesla (Hertz)$^{-\frac{1}{2}}$ can be constructed. Such a magnetometer contains in general, besides a SQUID sensor, also a flux transformer, with which the magnetic fields to be detected can be coupled into the SQUID sensor.

In such magnetometers, the outermost limit for their sensitivity is determined by the so-called 1/f noise, i.e., inversely proportional to the frequency (see, for instance, "Journal of Low Temperature Physics," Vol. 51, nos. $\frac{1}{2}$, 1983, pages 207 to 224).

In the publication "SQUID-Superconducting Quantum Interference Devices and Their Applications" (Proc. Int. Conf. on Superconducting Quantum Devices, Berlin, 1976), 1977, pages 439 to 484, a device for underwater communication can be seen, with which also magnetic fields with extremely low frequencies of 30 to 3000 Hz can be detected. This device comprises, among other things, an RF SQUID as a sensor which is arranged together with a superconducting flux transformer in a cryostat (see page 449, FIG. 3). This flux transformer comprises a field coil, also called a detection loop, which serves as an antenna and is connected to a coupling coil for coupling the measuring signal into the SQUID. These superconducting parts of the device can be realized, in particular, as a thin-film structure. The superconducting part of the device formed by the flux transformer and the SQUID sensor is followed by low-noise electronic circuitry.

For further reducing the noise, it is known in addition, to use d-c SQUIDs for such measuring devices (see, for instance "Applied Physics Letters," Vol. 40, no. 8, Apr. 15, 1982, pages 736 to 738).

If, however, quasi static magnetic fields with frequencies of, for instance, 0.01 Hz with measuring times in the range of seconds are to be measured, the known devices could not be used up to now because of the mentioned 1/f noise of the SQUID sensor which sets in below about 1 Hz. This applies particularly to fields from remote sources which cannot be influenced, for instance, modulated, and which have very little inhomogeneity. Special magnetometers can also not be used, in which a modulated signal is generated by the vibration of a detection coil. Similarly to this procedure, the modulation can also be brought about by the motion of a magnetic probe relative to a detection coil (see, for instance, the book by B. I. Bleaney and B. Bleaney: "Electricity and Magnetism," Third Edition, 1976, page 187). For the mentioned extremely low frequency range, the characteristic length of the field variation to be generated in this manner would then have to be much larger than the dimensions of the SQUID sensor and its coolant container surrounding it.

SUMMARY OF THE INVENTION

It is therefore an object of the present invention to provide an apparatus for measuring magnetic fields which change with an only extremely low frequency such that with it, also quasi static magnetic fields with frequencies far below about 1 Hz, particularly below 0.1 Hz, can be detected with the high magnetic field sensitivity typical for SQUID magnetometers.

The above and other objects of the present invention are achieved by an apparatus for measuring magnetic fields which change with an only extremely low frequency including a SQUID magnetometer comprising a superconducting flux transformer for inductively coupling the measuring signal into a d-c SQUID sensor, means for modulating the measuring signal to be coupled into the SQUID sensor being associated at least with the flux transformer, the modulation frequency of the modulating means being in a frequency range characteristic for low noise operation of the SQUID sensor.

With the flux transformer or parts thereof, a modulation, also called effect modulation, is thus performed, according to the invention, of the signal received by the detection coil or loop of the flux transformer. Thereby, the advantage can be achieved that the measuring frequency can be shifted into a working range of the SQUID, in which low-noise operation can be assured. This frequency range is generally above 1 Hz. The appropriate measures for the modulation can extend to part of the flux transformer, such as its detection loop or to its coupling coil individually or optionally also to the arrangement of the flux transformer and the SQUID jointly.

BRIEF DESCRIPTION OF THE DRAWINGS

For a further explanation of the invention and its various embodiments, reference is made to the drawing figures, in which.

DETAILED DESCRIPTION

Approach I

Figure 1:
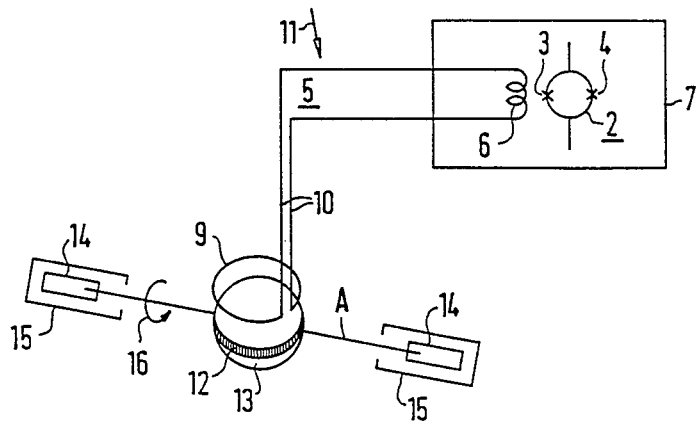
FIG. 1 shows a modulating device of the measuring apparatus according to the invention schematically.

According to FIG. 1, the measuring apparatus according to the invention comprise a d-c SQUID 2 having two Josephson tunnel elements 3 and 4. To the SQUID a superconducting flux transformer 5 is coupled inductively via a coupling coil 6. The SQUID and the coupling coil, for instance, integrated therewith, are surrounded by a superconducting shield 7. Besides the coupling coil, the flux transformer 5 contains, for receiving the magnetic field to be measured, a flat detection or sensing loop 9 which is connected to the coupling coil 6 via superconducting connecting conductors 10. Instead of the plane (flat) sensing loop shown in the figure with a single winding, a Helmholtz coil can also be used. Currents in the flux transformer are brought down to zero prior to the start of the measurement proper in a manner known per se. As is indicated in the figure by a line 11 with arrows, such a null adjustment zeroing of the transformer currents can be made for instance, by means of heat pulses which can be fed in via light guides. The flux transformer can also be made currentless by a special negative feedback.

According to the invention, the magnetic field to be received by the detection loop 9 is modulated by a moving shielding ring 12 with such a frequency that the measuring signal is shifted into a frequency range of the SQUID 2 such that low-noise operation can be assured. Appropriate modulating frequencies are generally above 1 Hz and preferably above 100 Hz, for instance, above 1 kHz.

For the modulation, the shielding ring 12 can advantageously be arranged as an annular metal film on a spherical carrier 13. This metal film can particularly comprise a superconducting material, the transition temperature of which is as closely as possible above the temperature of the required cryogenic medium with which it can be cooled. Also, this shielding ring 12 can be transferred easily into the normal conducting state, for instance, optically. The carrier 13 receiving the metal film is fastened to a shaft A, the opposite free ends of which are mounted in a superconducting magnetic bearing 14 with a superconducting shield 15. The fields for these magnetic bearings are advantageously built up only when the superconducting state of the bearing shields with short circuited superconducting coils is present which require no feed currents in operation. As is indicated in the figure by arrow 16, the carrier 13 can rotate as part of a modulation rotor, not detailed further, which may be part of a stabilizing gyro system about the axis A disposed transversely about the shielding ring 12 and parallel to the detecting loop 9, with a predetermined speed. With such rotation, the shielding ring 12 modulates the flux in the detection loop 9 with the corresponding modulating frequency. A signal characterizing the rotor angle for the modulation of the measuring signal can be taken inductively from a rotor bearing.

The so-designed magnetometer having the SQUID 2 is advantageously arranged in a coolant container with superfluid helium in order thereby to keep the damping of the rotor low. The damping of the rotor rotation can be made small, for instance, by rotating magnetic fields which act on a superconducting short-circuit rotor in the superconductingly shielded rotor bearings.

According to the embodiment shown in the figure, it was assumed that the field received by the sol detecting loop 9 arranged in a plane is modulated by the shielding ring 12. However, this shielding ring can act equally as well on two corresponding orthogonally arranged detecting loops.

In addition, the realization of a small stabilized platform in the superfluid helium which carries only the detection system proper is conceivable where again superconducting magnetic bearings and superconducting shields can be used.

For compensating a constant background field, a coil arrangement which is rigidly connected to the measuring system can be used. In order to obtain the highest possible stability of the compensation field, the latter can advantageously be generated by means of superconducting coils which are short-circuited via superconducting switches. Mechanical stabilization of the measuring system relative to the constant background field also must be provided.

Also interfering fields of the environment, if they are caused by moving magnetic objects of the environment, can be reduced by compensating coils rigidly connected to the moving objects. In addition, a substantial suppression of interfering fields of the immediate surroundings of the measuring field can be achieved by using a remote reference in the form of a remotely placed further measuring system and by forming the coherence function of the partial signals.

The device, indicated in FIG. 1, for the modulation of the measuring signal, involves shielding measures acting periodically on the detecting loop of the superconducting flux transformer. Such modulation, however, can be achieved equally well with other parts of the flux transformer. A corresponding further approach will be disclosed in the following, making reference to FIGS. 2 to 6.

Approach II

Figure 2:
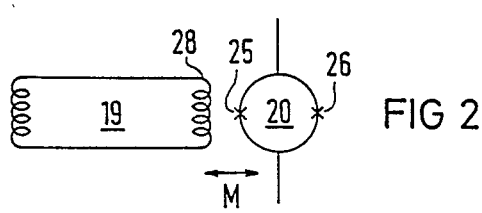
FIGS. 2 to 6 show schematically further embodiments of such modulation devices. In the figures, like parts are provided with like reference symbols.

As can be seen from the circuit diagram of FIG. 2, a modulation of the mutual inductance M between a superconducting flux transformer 19 and a SQUID 20 associated with it is possible. For this purpose, differing from the case of gravity wave detectors (see, for instance, "IEEE Transactions on Magnetics," Vol. MAG-19, no. 3, May 1983, pages 461 to 468), in which the mutual induction changes with a moving test mass, the current in the flux transformer is brought to zero prior to the beginning of the measurement, since then only the small changes of the field to be measured lead to currents in the flux transformer, the action of which on the SQUID is modulated in the desired manner.

Figure 3:
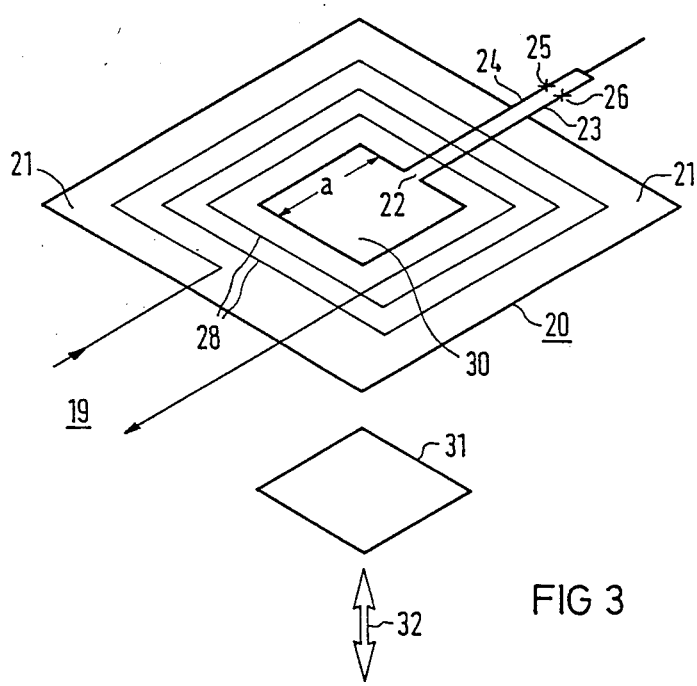

In order to keep the effectiveness of the flux transformer, 19, the so-called "flux transfer" as large as possible for the circuit according to FIG. 2, one can advantageously start out, according to the embodiment schematically indicated as an oblique view in FIG. 3 from a d-c SQUID 20 known per se. This SQUID, together with the associated part of the flux transformer 19 can be constructed by a thin-film technique (see "IEEE Transactions on Magnetics," Vol. MAG-17, no. 1, January 1981, pages 400 to 403). The SQUID 20 has a wide ring-shaped loop 21 of superconductive material which is interrupted on one side by a narrow gap or slot 22 and ends there in two narrow conductor runs 23 and 24 which lead to the other side. For optimizing the flux coupling into the SQUID, i.e., for minimizing the losses in the gap 22, the gap is advantageously closed by a special covering or by an overlap of the two conductor runs. In the vicinity of these conductor runs leading to the outside, the two Josephson tunnel elements 25 and 26 characteristic of a d-c SQUID are arranged. On the ring-shaped loop 21 are arranged the turns of the flat coupling coil 28 of the flux transformer 19.

This ring-shaped loop 21 encloses a small, for instance, square coupling hole 30 with a side dimension a of, for instance, about 50 $\mu$m. According to the invention, this coupling hole and thereby he mutual inductance M of the coupling coil can be modulated. For this purpose is provided a superconducting ring loop 31 which is removed only a few $\mu$m from the thin film structure of the SQUID 20 or the ring-shaped loop 21 thereof. As indicated in the figure by a double arrow 32, this ring loop 31 closes off the coupling hole 30 with the predetermined modulation frequency more or less. To this end, the ring loop 31 can be arranged, for instance, on a silicon diaphragm which is moved, for instance, piezoelectrically, acoustically or mechanically. The modulation frequency is above 1 Hz, and preferably more than 100 Hz, for instance, above 1 kHz. The ring loop 31 should advantageously comprise a superconductive material, the critical temperature of which is only just above the temperature of the cooling bath of a corresponding cryogenic medium. In addition, zeroing of the current in the loop prior to the start of the measurement is important. This can be accomplished, for instance, by heating via light guides.

In the approach described in conjunction with FIGS. 2 and 3, for modulating the measurement signal, the SQUID signal cannot be obtained by a carrier frequency method known per se, the frequencies of which are in the range of about 100 kHz, since modulation by changing the effective coupling hole size would at the same time also change the modulation amplitude of the carrier frequency. A circuit which can be used to advantage in this case and in which the SQUID is operated as a low-frequency flux amplifier without modulation can be seen from the circuit sketch of FIG. 4. This is based on a circuit suggested in the publication "SQUID 80," 1980, pages 227 to 235.

Figure 4:
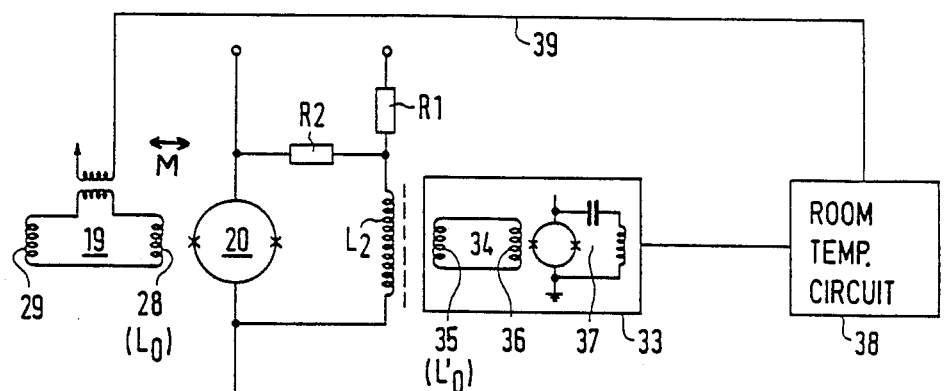
Figure 5:
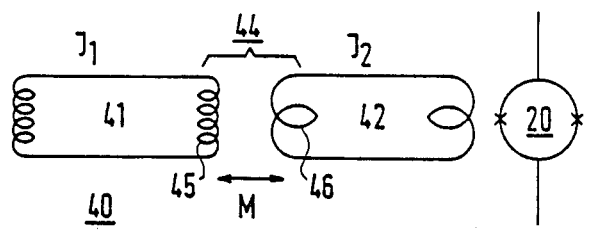

According to FIG. 4, the measurement signal is fed to the SQUID 20 via a flux transformer 19 having a detection loop 29 and a coupling coil 28. With the SQUID is associated a low impedance which has an ohmic resistance $R_2$ which is approximately equal to the dynamic resistance $R_s$ of the SQUID 20 and is connected in series with an inductance $L_2$. Via this inductance, the measurement signal can be coupled inductively into a superconducting read-out flux sensor 33 which contains, for instance, also a flux transformer 34 with an input coil 35 and a coupling coil 36 as well as a d-c SQUID 37. The flux sensor is followed by an electronic circuit 38 at room temperature.

For the ratio $R_2/L_2$ (Hz), the smallest value compatible with the measurement problem, i.e., the upper frequency limit $v_g$ of, for instance, 1 kHz is chosen. Via a resistor $R_1$, a base current is impressed on the inductance $L_2$ which sets the flux references for the null instrument to be read. The maximum current redirected past the SQUID into the inductance $L_2$ is approximately equal to the critical current $I_c$ of the superconductive material. For a lossless inductive coupling of the flux in the coupling coil 28 with an input inductance $L_0$ to the SQUID with the inductance $L_s$ and again lossless coupling of the flux from $L_2$ into an inductance $L'_0$, which is approximately equal to the input inductance $L_0$ of the input coil 35 of the subsequent flux sensor 33, the flux amplification FV from $L_0$ to $L'_0$ is then approximately equal to the ratio $\sqrt{L_2/L_s}$. For concrete values of $R_2=10$ ohms, $v_g=1$ kHz, $L_2=10^{-2}$ H, $L_s=10^{-10}$ H, $L_s=10^{-10}$ H, a flux amplification of $10^4$ is then obtained. Even with realistic total losses of two orders of magnitude, a flux amplification in one stage of SQUID amplifiers which can be connected in series, of about $10^2$ remains. Such flux amplification is sufficient in any case to drive or fully modulate a conventional flux meter such as a flux gate sensor. However, a SQUID, for instance, can also be used as the read-out amplifier. In the latter case the inductance $L_2$ in the order of about $10^{-2}$ H is advantageously a coil which is wound of thin Nb wire which rests on a foil winding, the inductance of which is matched to the inductance of the read-out SQUID coupling coil 36 of about 0.3 $\mu$H.

The read-out SQUID 37 can be operated conventionally, i.e., with modulation, since it is driven much farther than the primary SQUID 20. By negative feedback, advantageously with an integrator, and advantageously up to the flux transformer 19 of the primary SQUID 20, the entire circuit is linearized. Such negative flux feedback from the electronic circuit 38 to the flux transformer 19 is designated in the figure with 39.

The circuit shown in FIG. 4 yields the particular advantage that exactly the operating point with the largest transfer function and the lowest intrinsic noise of the primary SQUID 20 can be stabilized by the flux reference in $L_2$. No modulation drives the primary SQUID from this state as long as the negative feedback 39 is effective. The flux reference given by a d-c current is not subjected here to any undesired thermal voltage drifts. Such drifts also do not occur during the operation of flux or current read-out by a read-out instrument. Through the choice of an amplifier cascade at low temperature in the form of the primary SQUID 20 and the read-out instrument in the form of the sensor 33, the electronic circuitry 38 at room temperature can be kept relatively simple.

Deviating from the modulation of the mutual inductance with respect to the SQUID, it is also possible to divide the flux transformer in the manner known per se into two stages (see, for instance "IEEE Transactions on Magnetics," vol. MAG-19, no. 3, 1983, pages 303 to 307). A corresponding circuit diagram can be seen in FIG. 5. The flux transformer designated with 40 accordingly contains two loop-like stages 41 and 42 which each represent quasi individual smaller flux transformers and in which currents $J_1$ and $J_2$ flow. The coupling between these stages with a mutual inductivity M is accomplished by a pancake coil transformer 44 constructed in a manner known per se (see, for instance, U.S. Pat. No. 3,184,674). The transformer coils to be associated with the stages 41 and 42 are designated with 45 and 46.

Figure 6:
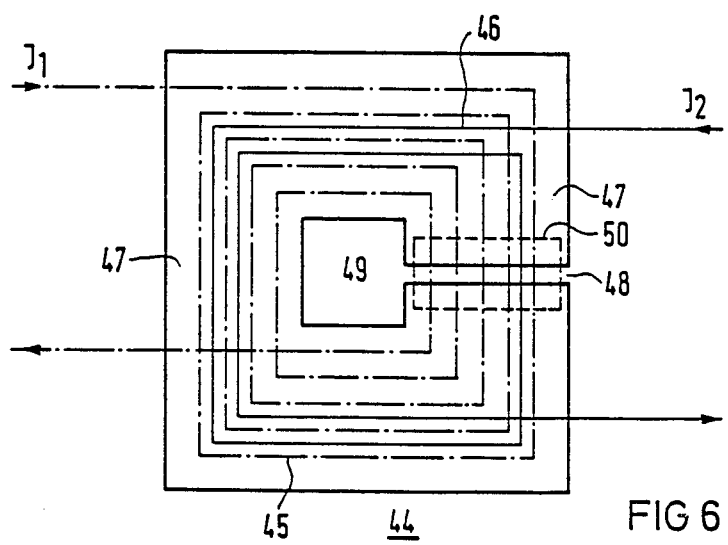

This transformer 44 is detailed schematically in FIG. 6 in a top view. It contains two integrated thin-film coils 45 and 46 which are illustrated by a dash-dotted or solid line. These coils are applied together and on top of each other on a slotted ring 47 with an overlapping or covered slot 48 and coupling hole 49. The slot covering designated with 50 is indicated by a dashed line. Thus, this transformer 44 largely corresponds to the transformer 20 shown in FIG. 3, if one neglects that the ring 47 does not have Josephson elements. Like in the embodiment according to FIG. 3, here too, a modulation of the effective size of the coupling hole with a superconducting ring loop is performed. Prior to the start of the measurement, the two currents $J_1$ and $J_2$ in the thin-film coils 45 and 46, are set to zero in the described manner. With the possibility of modulation indicated by means of FIGS. 5 and 6, the customary carrier frequency method can be used for reading out the SQUID signal.

Approach III

Besides the described modulation measures which act directly on a flux transformer 5, 19 or 40 associated with a d-c SQUID sensor, one can also periodically rotate the coolant container containing at least the SQUID and its flux transformer about an axis, necessarily at a low frequency of about 1 Hz, which goes through the plane of the detection loop of the flux transformer. The desired modulation can be achieved likewise in this manner. A compensation of static background fields can be performed here by coils outside the coolant container. The phase of the detection signal then gives information about the direction of the projection of the field to be measured in the plane of rotation. If two orthogonal rotating coolant containers are provided with appropriate measuring devices, field vectors can be determined.

Also for the Approaches II and III, the measures cited in connection with Approach I with respect to a suppression of interfering fields by auxiliary fields and the use of a remote reference, can be provided. In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. Apparatus for measuring magnetic fields which change with an only extremely low frequency including a SQUID magnetometer comprising a superconducting flux transformer for inductively coupling a measuring signal into a d-c SQUID sensor, means for modulating the measuring signal to be coupled into the SQUID sensor, said modulation means being associated with at least the flux transformer, a modulation frequency of the modulation means being in a frequency range characteristic for low noise operation of the SQUID sensor, said modulation means comprising a superconducting shielding ring which is periodically moved with the modulation frequency for modulating a magnetic flux in a detection loop of the flux transformer.

2. The apparatus recited in claim 1, wherein the SQUID sensor and a coupling coil of the associated flux transformer are integrated to form a structural unit in thin-film technology.

3. The apparatus recited in claim 2, wherein the SQUID sensor and the associated coupling coil are surrounded by a superconducting shield.

4. The apparatus recited in claim 1, wherein the shielding ring is supported rotatably about an axis which is disposed transversely to the shielding ring and parallel to a plane of the detection loop.

5. The apparatus recited in claim 4, further comprising superconducting bearing means having superconducting shields for a magnetic bearing support of the rotating shielding ring.

6. The apparatus recited in claim 4, wherein the rotating shielding ring is arranged in a container filled with superfluid helium.

7. The apparatus recited in claim 1, further comprising an electronic read-out circuit coupled to the SQUID sensor with negative feedback going from the electronic read-out circuit to the flux transformer.

8. The apparatus recited in claim 1, wherein a modulation frequency above 1 Hz and preferably above 100 Hz is provided.

9. Apparatus for measuring magnetic fields which change with an only extremely low frequency including a SQUID magnetometer comprising a superconducting flux transformer for inductively coupling a measuring signal into a d-c SQUID sensor, means for modulating the measuring signal to be coupled into the SQUID sensor, said modulation means being associated with at least the flux transformer, a modulation frequency of the modulation means being in a frequency range characteristic for low noise operation of the SQUID sensor, said modulation means comprising means for modulating a mutual inductance between the flux transformer and the SQUID sensor, the SQUID sensor having a superconducting, ring-shaped slotted loop on which the turns of the coupling coil of the flux transformer are arranged and which surrounds a coupling hole, the effective size of said coupling hole being modulated, said modulation means comprising a superconducting ring loop disposed adjacent said coupling hole at a small distance therefrom, said superconducting ring loop being movable toward and away from said coupling hole at a modulation frequency thereby to modulate the effective size of said coupling hole, said coupling hole being coupled to said flux transformer by the mutual inductance of a coupling coil of said flux transformer and said SQUID sensor.

10. The apparatus recited in claim 9, wherein the SQUID sensor is coupled to a flux amplifier which is operated without modulation and which comprises a flux sensor and electronic read-out circuitry.

11. The apparatus recited in claim 10, wherein the SQUID sensor is shunted by a load circuit having an ohmic load resistance connected in series with an inductance, via which the signal is inductively coupled into the flux sensor of the flux amplifier.

12. The apparatus recited in claim 10, wherein the flux sensor comprises a d-c SQUID for a read-out function.u 13. The apparatus recited in claim 9, wherein the SQUID sensor and a coupling coil of the associated flux transformer are integrated to form a structural unit in thin film technology.

14. The apparatus recited in claim 13, wherein the SQUID sensor and the associated coupling coil are surrounded by a superconducting shield.

15. The apparatus recited in claim 9, further comprising an electronic read-out circuit coupled to said SQUID sensor with negative feedback going from the electronic read-out circuit to the flux transformer.

16. The apparatus recited in claim 9, wherein a modulation frequency above 1 Hz and preferably above 100 Hz is provided.

17. Apparatus for measuring magnetic fields which change with an only extremely low frequency including a SQUID magnetometer comprising a superconducting flux transformer for inductively coupling a measuring signal into a d-c SQUID sensor, means for modulating the measuring signal to be coupled into the SQUID sensor, said modulation means being associated with at least the flux transformer, a modulation frequency of the modulation means being in a frequency range characteristic for low noise operation of the SQUID sensor, and further wherein the flux transformer is divided into two individual stages forming smaller flux transformers which are inductively coupled together via a coupling transformer, the modulation means comprising means for modulating a mutual inductance of the coils of the coupling transformer, the coils of the coupling transformer surrounding a common coupling hole, the effective size of said coupling hole being modulated by said modulation means comprising a superconducting ring loop disposed adjacent said coupling hole at a small distance therefrom, said superconducting ring loop being movable toward and away from said coupling hole at a modulation frequency thereby to modulate the effective size of said coupling hole, said coupling hole being coupled to said flux transformer by the mutual inductance of the coils of the coupling transformer.

18. The apparatus recited in claim 17, wherein the SQUID sensor and a coupling coil of the associated flux transformer are integrated to form a structural unit in thin film technology.

19. The apparatus recited in claim 18, wherein the SQUID sensor and the associated coupling coil are surrounded by a superconducting shield.

20. The apparatus recited in claim 17 further comprising an electronic read-out circuit coupled to said SQUID sensor with negative feedback going from an electronic read-out circuit to the flux transformer.

21. The apparatus recited in claim 17, wherein a modulation frequency above 1 Hz and preferably above 100 Hz is provided.

* * * * *